(12) United States Patent
Tamari et al.

(10) Patent No.: US 8,575,658 B2
(45) Date of Patent: *Nov. 5, 2013

(54) SEMICONDUCTOR DEVICE AND METHOD FOR MANUFACTURING SAME

(75) Inventors: Shinichi Tamari, Kagoshima (JP); Mitsuhiro Nakamura, Kagoshima (JP); Koji Wakizono, Kagoshima (JP); Tomoya Nishida, Kagoshima (JP); Yuji Ibusuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/538,583

(22) Filed: Jun. 29, 2012

(65) Prior Publication Data

US 2012/0267684 A1 Oct. 25, 2012

Related U.S. Application Data

(63) Continuation of application No. 12/805,160, filed on Jul. 15, 2010, now Pat. No. 8,378,389.

(30) Foreign Application Priority Data

Aug. 3, 2009 (JP) .................................. 2009-180653
Feb. 16, 2010 (JP) .................................. 2010-031710

(51) Int. Cl.
*H01L 29/80* (2006.01)
(52) U.S. Cl.
USPC .................... 257/195; 257/E29.315; 438/172
(58) Field of Classification Search
USPC .......... 257/192, 194, 195, E29.315, E29.316, 257/E21.403; 438/172, 188
See application file for complete search history.

(56) References Cited

U.S. PATENT DOCUMENTS

| 5,250,826 | A | 10/1993 | Chang et al. |
| 5,479,033 | A | 12/1995 | Baca et al. |
| 5,837,617 | A | 11/1998 | Oguri et al. |
| 6,410,947 | B1 | 6/2002 | Wada |
| 8,378,389 | B2 * | 2/2013 | Tamari et al. ................. 257/195 |
| 2001/0002706 | A1 | 6/2001 | Hase et al. |

FOREIGN PATENT DOCUMENTS

| JP | 61-067275 | 4/1986 |
| JP | 11-150264 | 6/1999 |

* cited by examiner

*Primary Examiner* — Julio J Maldonado
*Assistant Examiner* — Daniel Shook
(74) *Attorney, Agent, or Firm* — Rader, Fishman & Grauer PLLC

(57) ABSTRACT

A semiconductor device includes a compound semiconductor substrate; a first conductivity type-channel field-effect transistor region formed on the compound semiconductor substrate, and that includes a first channel layer; a first conductivity type first barrier layer that forms a heterojunction with the first channel layer, and supplies a first conductivity type charge to the first channel layer; and a second conductivity type gate region that has a pn junction-type potential barrier against the first conductivity type first barrier layer; and a second conductivity type-channel field-effect transistor region formed on the compound semiconductor substrate, and that includes a second conductivity type second channel layer, and a first conductivity type gate region that has a pn junction-type potential barrier against the second conductivity type second channel layer.

14 Claims, 16 Drawing Sheets

SEMICONDUCTOR DEVICE AND METHOD FOR MANUFACTURING SAME

CROSS REFERENCE TO RELATED APPLICATIONS

This is a continuation application of U.S. patent application Ser. No. 12/805,160, filed Jul. 15, 2010, which claims priority from Japanese Application Nos.: 2009-180653, filed on Aug. 3, 2009 and Japanese Application No.: 2010-031710, filed on Feb. 16, 2010, the entire contents of which are incorporated herein by reference.

BACKGROUND OF THE INVENTION

1. Field of the Invention

The present invention relates to compound semiconductor field-effect transistors, particularly to semiconductor devices that include an n-type high electron mobility transistor and a p-type field-effect transistor formed on the same compound semiconductor substrate.

2. Description of the Related Art

Field-effect transistors with a compound semiconductor layer of a material such as GaAs have high electron mobility and desirable frequency characteristics, and for this reason have been widely used with an n-channel for high-frequency region applications such as in cellular phones. The n-channel FET (Field Effect Transistor) currently in use for the high frequency band is the high electron mobility transistor (HEMT). Its variant pseudomorphic high electron mobility transistor (PHEMT; Pseudomorphic HEMI) is also known that tolerates certain degrees of lattice mismatch in epitaxial growth, and thus realizes even higher electron mobility. JPHEMTs (Junction Pseudomorphic HEMTs) that form a PN junction at a gate portion are also known (see, for example, JP-A-11-150264). In JPHEMTs, a large positive voltage is applied to the gate to reduce the carrier depleted region formed in a channel layer, and thereby reduce the parasitic resistance component of the channel layer.

With the movement toward high performance n-channel FETs, there is an increasing demand for higher integration, which requires the development of complementary elements using a compound semiconductor. Ion implantation is a common technique to simultaneously form n-channel and p-channel FETs on a compound semiconductor. In this technique, an n-channel forming region and a p-channel forming region are formed by selectively injecting a p-type dopant and an n-type dopant into the same substrate. However, the ion implantation technique requires high-temperature annealing of at least 800° C. after the ion implantation, in order to activate the injected dopants.

JP-A-61-67275 describes a method of simultaneously forming an n-channel FET and a p-channel FET on a compound semiconductor. According to this publication, an n-channel-type heterojunction field-effect transistor using a two-dimensional electron gas as the carrier, and a p-channel-type heterojunction field-effect transistor using a two-dimensional hole gas as the carrier are formed on a compound semiconductor substrate of GaAs. The n-channel-type heterojunction field-effect transistor includes a non-doped GaAs layer, a non-doped AlGaAs layer, an n-type impurity doped AlGaAs layer, and an n-type impurity doped GaAs layer. Each layer is laminated using an epitaxial growth method. The n-type impurity doped AlGaAs layer has a gate electrode of aluminum or titanium/platinum/gold. The n-type impurity doped GaAs layer has source and drain electrodes of gold-germanium/gold. The p-channel-type heterojunction field-effect transistor includes a non-doped GaAs layer, a non-doped AlGaAs layer, a p-type impurity doped AlGaAs layer, and a p-type impurity doped GaAs layer laminated on the laminate structure using an epitaxial growth method. The p-type impurity doped AlGaAs layer has a gate electrode of Al or titanium/platinum/gold. Source and drain electrodes of gold/zinc/gold are formed on the p-type impurity doped GaAs layer.

SUMMARY OF THE INVENTION

Applying the ion implantation technique to HEMTs requires a heat treatment of at least 800° C. after the impurity doping. However, because the heterojunction is formed using an epitaxial growth method performed at a temperature of about 600° C., the annealing temperature of 800° C. or more causes the interdiffusion of the compound composition element or impurity element to occur at the heterojunction interface, making it difficult to realize the heterojunction as intended.

The gates in the field-effect transistors described in JP-A-61-67275 are of a Schottky barrier type. It is therefore difficult to control the threshold voltage, or to operate the p-channel field-effect transistor in an enhancement mode. This presents a problem in realizing complementary transistors with reduced leak current by forming an n-channel field-effect transistor and a p-channel field-effect transistor on the same substrate.

The present invention addresses the foregoing and other problems associated with conventional methods and devices.

According to an embodiment of the present invention, there is provided a semiconductor device that includes: a compound semiconductor substrate; an n-channel field-effect transistor region formed on the compound semiconductor substrate, and that includes a first channel layer; an n-type first barrier layer that forms a heterojunction with the first channel layer, and supplies an n-type charge to the first channel layer; and a p-type gate region that has a pn junction-type potential barrier against the n-type first barrier layer; and a p-channel field-effect transistor region formed on the compound semiconductor substrate, and that includes: a p-type second channel layer, and an n-type gate region that has a pn junction-type potential barrier against the p-type second channel layer.

The semiconductor device according to the embodiment of the present invention may be configured such that the p-channel field-effect transistor region be a region that includes the first channel layer, the n-type first barrier layer, and the second channel layer laminated in this order above the compound semiconductor substrate.

The semiconductor device according to the embodiment of the present invention may be configured such that the n-channel field-effect transistor region be a region that includes the p-type second channel layer; an n-type gate layer formed simultaneously with the n-type gate region; the first channel layer; and the n-type first barrier layer laminated in this order above the compound semiconductor substrate.

The semiconductor device according to the embodiment of the present invention may be configured to further include a gate-leak prevention layer between the n-type gate region and the p-type second channel layer.

The semiconductor device according to the embodiment of the present invention may be configured such that the p-type second channel layer include p-type source and drain regions formed as Zn-diffused layers, and that are separated from each other with the n-type gate region in between.

The semiconductor device according to the embodiment of the present invention may be configured to further include an n-type second barrier layer formed between the compound semiconductor substrate and the first channel layer, and that supplies an n-type charge to the first channel layer.

The semiconductor device according to the embodiment of the present invention may be configured such that the p-channel field-effect transistor region include a backgate electrode.

The semiconductor device according to the embodiment of the present invention may be configured such that the backgate electrode of the p-channel field-effect transistor be formed on the n-type first barrier layer.

According to another embodiment of the present invention, there is provided a semiconductor device manufacturing method that includes the steps of: forming a multilayered film by the sequential epitaxial growth of a first buffer layer, a first channel layer, an n-type first barrier layer, a second buffer layer, a p-type second channel layer, and an n-type gate layer on a compound semiconductor substrate; selectively removing the n-type gate layer to form an n-type gate region for a p-channel field-effect transistor; selectively removing the p-type second channel layer so as to lay out a p-channel field-effect transistor region in which the p-type second channel layer remains with the n-type gate region, and an n-channel field-effect transistor region in which the n-type first barrier layer remains; forming an insulating film simultaneously on exposed surfaces of the p-channel field-effect transistor region and the n-channel field-effect transistor region, and forming first opening portions through the insulating film; diffusing Zn impurities through the first opening portions to simultaneously form source and drain regions for the p-channel field-effect transistor, and a gate region for an n-channel field-effect transistor; forming an element isolation region that electrically separates the p-channel field-effect transistor region and the n-channel field-effect transistor region from each other; and forming a metal electrode in the source and drain regions for the p-channel field-effect transistor, and in the gate region for the n-channel field-effect transistor.

The semiconductor device manufacturing method according to the embodiment of the present invention may be configured to further include the step of forming a backgate electrode for the p-channel field-effect transistor on the n-type first barrier layer simultaneously when forming a metal electrode in source and drain regions for the n-channel field-effect transistor.

According to still another embodiment of the present invention, there is provided a semiconductor device manufacturing method that includes the steps of: forming a multilayered film by the sequential epitaxial growth of a first buffer layer, a p-type second channel layer, an n-type gate layer, an n-type second barrier layer, a first channel layer, and an n-type first barrier layer on a compound semiconductor substrate; forming an element isolation region that electrically separates a p-channel field-effect transistor region and an n-channel field-effect transistor region from each other; selectively removing the n-type first barrier layer, the first channel layer, and the n-type second barrier layer of the p-channel field-effect transistor region; selectively removing the n-type gate layer of the p-channel field-effect transistor region to form an n-type gate region for a p-channel field-effect transistor; forming an insulating film simultaneously on exposed surfaces of the p-channel field-effect transistor region and the n-channel field-effect transistor region, and forming opening portions through the insulating film; diffusing Zn impurities through the opening portions to simultaneously form source and drain regions for the p-channel field-effect transistor, and a gate region for an n-channel field-effect transistor; and forming a metal electrode in the source and drain regions for the p-channel field-effect transistor, and in the gate region for the n-channel field-effect transistor.

The semiconductor device manufacturing method according to the embodiment of the present invention may be configured to further include the step of forming a backgate electrode for the p-channel field-effect transistor on the n-type first barrier layer simultaneously when forming a metal electrode in source and drain regions for the n-channel field-effect transistor.

In the semiconductor device according to the embodiment of the present invention, an n-channel high electron mobility transistor and a p-channel field-effect transistor are formed on the same compound semiconductor substrate. The n-channel field-effect transistor includes a first channel layer; an n-type first barrier layer that forms a heterojunction with the first channel layer, and supplies an n-type charge to the first channel layer; and a p-type gate region that has a pn junction-type potential barrier against the n-type first barrier layer. The p-channel field-effect transistor includes a p-type second channel layer, and an n-type gate region that has a pn junction-type potential barrier against the p-type second channel layer. Because the gate region of each transistor has a pn junction-type potential barrier, the turn-on voltage can be increased more than that in the Schottky barrier. Further, the control of threshold voltage and the operation in an enhancement mode can be realized with ease while reducing the reversed gate leak current.

DESCRIPTION OF THE PREFERRED EMBODIMENTS

Figure 1:
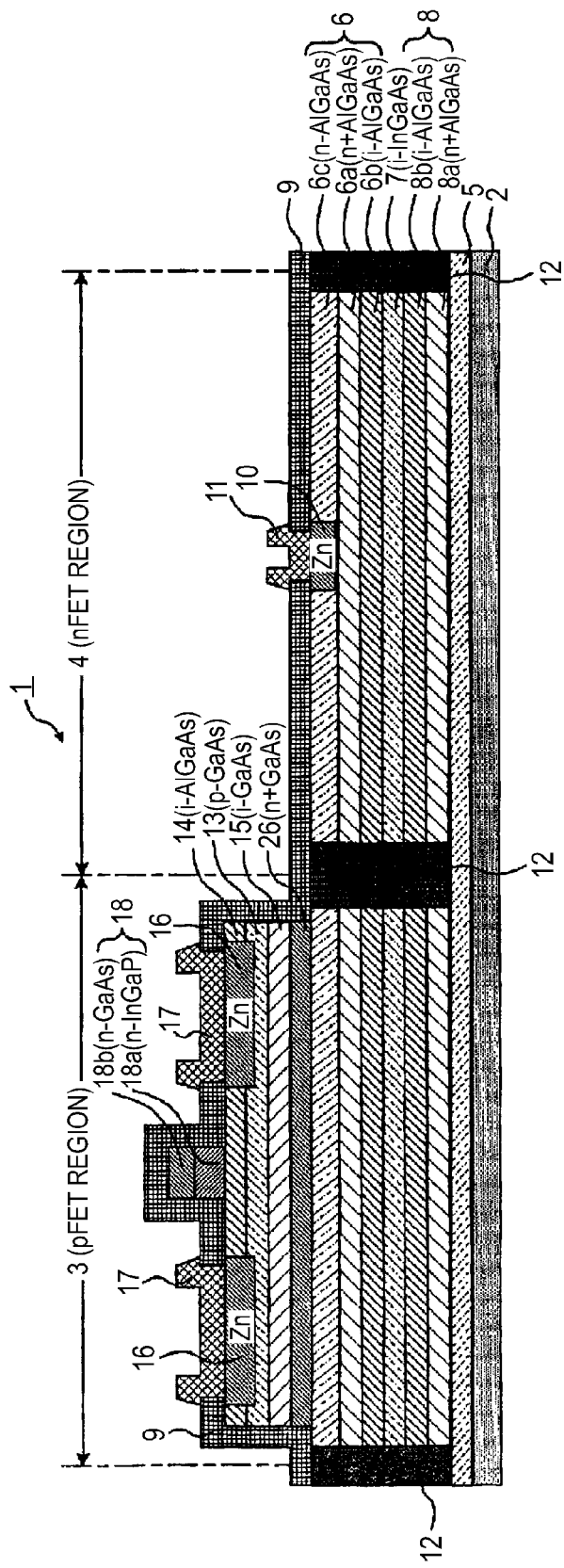
FIG. 1 is a schematic longitudinal sectional view of a semiconductor device according to an embodiment of the present invention.

A semiconductor device according to an embodiment of the present invention includes a p-channel field-effect transistor-forming region (hereinafter, "pFET region"), and an n-channel field-effect transistor-forming region (hereinafter, "nFET region") on a single compound semiconductor substrate.

The nFET region includes an n-type second barrier layer, a first channel layer, an n-type first barrier layer, a p-type gate region formed on the n-type first barrier layer, and a gate electrode on the compound semiconductor substrate. The n-type second barrier layer can be omitted.

The interface between the n-type second barrier layer and the first channel layer, and between the first channel layer and the n-type first barrier layer are heterojunction interfaces. The n-type first barrier layer and the n-type second barrier layer have a wider band gap than the first channel layer. A pn junction-type potential barrier occurs between the n-type first barrier layer and the p-type gate region. The pn junction-based potential barrier has a higher built-in voltage than a Schottky barrier. Thus, a higher positive voltage can be applied to the p-type gate region. Applying a positive voltage to the p-type gate region produces a well potential at the interface between the first channel layer and the n-type first barrier layer or the n-type second barrier layer. The electrons supplied from the n-type first barrier layer or the n-type second barrier layer to the well potential behave like a high-mobility two-dimensional electron gas. The electrons are therefore able to move at high speed between the source and drain regions (not illustrated), and a fast-operating switching element can be realized.

The pFET region includes a gate-leak prevention layer, a second channel layer, an n-type gate region, and source and drain regions on the n-type first barrier layer. Gate leak current can be reduced by the provision of the gate-leak prevention layer. The gate-leak prevention layer can be omitted. The pFET region 3 and the nFET region 4 are electrically separated from each other by an element isolation region 12.

The n-type gate region has a pn junction-type potential barrier against the second channel layer, enabling driving in an enhancement mode in which the gate voltage applied to the gate is lower than that in a Schottky-type gate field-effect transistor. Further, by adjusting the impurity concentration of the n-type gate region, the controllability of the transistor threshold voltage can be improved. Negative voltage is applied to the n-type gate region to vary the depth of the depletion layer formed in the second channel layer, and thereby control the current (holes) that flows between the source and drain.

Because the nFET and pFET having a pn junction-type gate region are formed on the same substrate using a compound semiconductor, complementary FETs having reduced leak current and capable of high-speed operation can be formed in high density.

Instead of forming the pFET on the n-type first barrier layer, a pFET that includes layers such as a second channel layer and an n-type gate layer may be first formed on the compound semiconductor substrate, and then an nFET that includes layers such as an n-type second barrier layer, a first channel layer, and an n-type first barrier layer may be formed on the n-type gate layer.

A semiconductor device manufacturing method of an embodiment of the present invention includes the steps of sequentially laminating a first buffer layer, a first channel layer, an n-type first barrier layer, a second buffer layer, a p-type second channel layer, and an n-type gate layer on a compound semiconductor substrate, selectively forming an n-type gate region to form a p-channel FET n-type gate region, selectively removing the second channel layer to lay out a pFET region and an nFET region, and forming an insulating film on the surface. The method further includes the steps of forming opening portions through the insulating film and diffusing Zn impurities to simultaneously form pFET source and drain regions and an nFET gate region, forming an element isolation region to separate the pFET region and the nFET region from each other, and simultaneously forming pFET source and drain electrodes in the pFET region, and a gate electrode in the nFET gate region.

As a result, the pFET region and the nFET region are formed on the upper level and the lower level, respectively, of the stepped product. With regard to the order of sequential lamination on the compound semiconductor substrate 2, the p-type second channel layer and the n-type gate layer may be deposited before laminating the n-type second barrier layer, the first channel layer, and the n-type first barrier layer in this order. In this case, the nFET region and the pFET region are formed on the upper level and the lower level, respectively, of the stepped product.

Because the pFET and the nFET can be simultaneously formed in the same step, the number of manufacturing steps can be reduced to lower the manufacturing cost.

First Embodiment

FIG. 1 is a schematic longitudinal sectional view of a semiconductor device according to First Embodiment of the present invention. The following detailed description will be given through the case where group III-V compounds are used for the compound semiconductor. First, an nFET region 4 is described. A GaAs monocrystalline substrate is used as a compound semiconductor substrate 2. A first buffer layer 5 is a non-doped i-GaAs layer with no impurities. An n-type second barrier layer 8 has a bilayer structure including an n-type charge supply layer 8a and a high-resistance layer 8b. The n-type charge supply layer 8a is an n$^+$AlGaAs layer doped with the n-type impurity Si a high concentration of $1.0 \times 10^{12}$ to $4.0 \times 10^{12}$ atoms/cm$^2$, and that has a thickness of about 3 nm. The high-resistance layer 8b is an i-AlGaAs layer with no impurities and having a thickness of about 3 nm. The first channel layer 7 is an i-InGaAs layer with no impurities and having a thickness of 5 nm to 15 nm. The n-type charge supply layer 8a is provided to supply electrons to the first channel layer 7. The high-resistance layer 8b is formed to provide a desirable heterojunction at the interface with the overlying, first channel layer 7.

An n-type first barrier layer 6 has a three-layer structure including a high-resistance layer 6b, a high-resistance layer 6c, and an n-type charge supply layer 6a sandwiched in between. The high-resistance layer 6b is an i-AlGaAs layer with no impurities and having a thickness of about 3 nm. The n-type charge supply layer 6a is an n⁺AlGaAs layer doped with the n-type impurity Si at a high concentration of $1.0 \times 10^{12}$ to $4.0 \times 10^{12}$ atoms/cm², and that has a thickness of about 6 nm. The high-resistance layer 6c is an n⁻AlGaAs layer doped with the n-type impurity Si at a low concentration of $1.0 \times 10^{10}$ to $4.0 \times 10^{11}$ atoms/cm², and that has a thickness of 70 nm to 200 nm. The n-type charge supply layer 6a is provided to supply electrons to the first channel layer 7. The high-resistance layer 6b is formed to provide a desirable heterojunction at the interface with the underlying, first channel layer 7.

A p-type gate region 10 is a p-type region formed in the Zn-diffused n⁻AlGaAs layer of the high-resistance layer 6c. An insulating film (silicon nitride film) 9 is formed on the upper surface of the high-resistance layer 6c, and an opening portion used for the diffusion of Zn is formed through the p-type gate region 10. A gate electrode 11 is formed in the opening portion. The gate electrode 11 is a metal electrode formed of sequentially laminated titanium (Ti), platinum (Pt), and gold (Au), and has an ohmic contact with the underlying, p-type gate region 10. Though not illustrated in FIG. 1, a source electrode and a drain electrode are formed on the both sides of the gate electrode 11. These electrodes have an ohmic contact with the high-resistance layer 6c.

A pFET region 3 is described below. The pFET region 3 has the same laminate structure as the nFET region 4 up to the high-resistance layer 6c. A cap layer (n⁺GaAs layer) 26 containing n-type impurities, for example, such as Si at a concentration of $6 \times 10^{18}$ atoms/cm³ is formed on the high-resistance layer 6c, and a second buffer layer (i-GaAs layer) 15 with no impurities and having a thickness of 10 nm to 100 nm is formed thereon.

A second channel layer 13 is formed on the second buffer layer 15, and is a p⁻GaAs layer doped with p-type impurities, for example, such as C (carbon) at a concentration of $1 \times 10^{16}$ to $5 \times 10^{18}$ atoms/cm³, and that has a thickness of 30 nm to 250 nm. A gate-leak prevention layer 14, an i-AlGaAs layer with no impurities and having a thickness of 0 nm to 50 nm, is formed on the second channel layer 13. An n-type gate region 18 has a bilayer structure including an n-type first gate layer 18a and an n-type second gate layer 18b on the gate-leak prevention layer 14. The n-type first gate layer 18a is formed of n⁻InGaP doped with n-type impurities such as Si at a concentration of $1 \times 10^{17}$ to $5 \times 10^{19}$ atoms/cm³, and that has a thickness of 10 nm to 50 nm. The n-type second gate layer 18b is formed of n⁻GaAs doped with n-type impurities such as Si at a concentration of $1 \times 10^{17}$ to $5 \times 10^{19}$ atoms/cm³, and that has a thickness of 50 nm to 200 nm.

Source and drain regions 16 are separated from each other with the n-type gate region 18 in between, and extend to a portion of the second channel layer 13 through the gate-leak prevention layer 14. The source and drain regions 16 are diffused regions in portions of the gate-leak prevention layer 14 and the second channel layer 13 where Zn impurities have been diffused. An insulating film (silicon nitride film) 9 is formed on the side surfaces of the second buffer layer 15, the second channel layer 13, the gate-leak prevention layer 14, and the n-type gate region 18, and on the surfaces of the gate-leak prevention layer 14 and the n-type gate region 18. The insulating film 9 has opening portions used to diffuse Zn in the source and drain regions 16, and metallic source and drain electrodes 17 are formed in the opening portions. These electrodes have an ohmic contact with the underlying, source and drain regions 16.

The element isolation region 12 is a boundary region for the pFET region 3 and the nFET region 4, and is formed through the n-type second barrier layer 8, the first channel layer 7, and the n-type first barrier layer 6. The element isolation region 12 is formed by the ion implantation of B (boron).

The p-channel FET including a pn junction gate in the pFET region 3, and the n-channel FET including a pn junction gate in the nFET region 4 are formed in this manner. In this way, the FETs, particularly the p-channel FET, can operate in an enhance mode, and fast-operating complementary FETs with reduced leak current can be realized.

Second Embodiment

Figure 2:
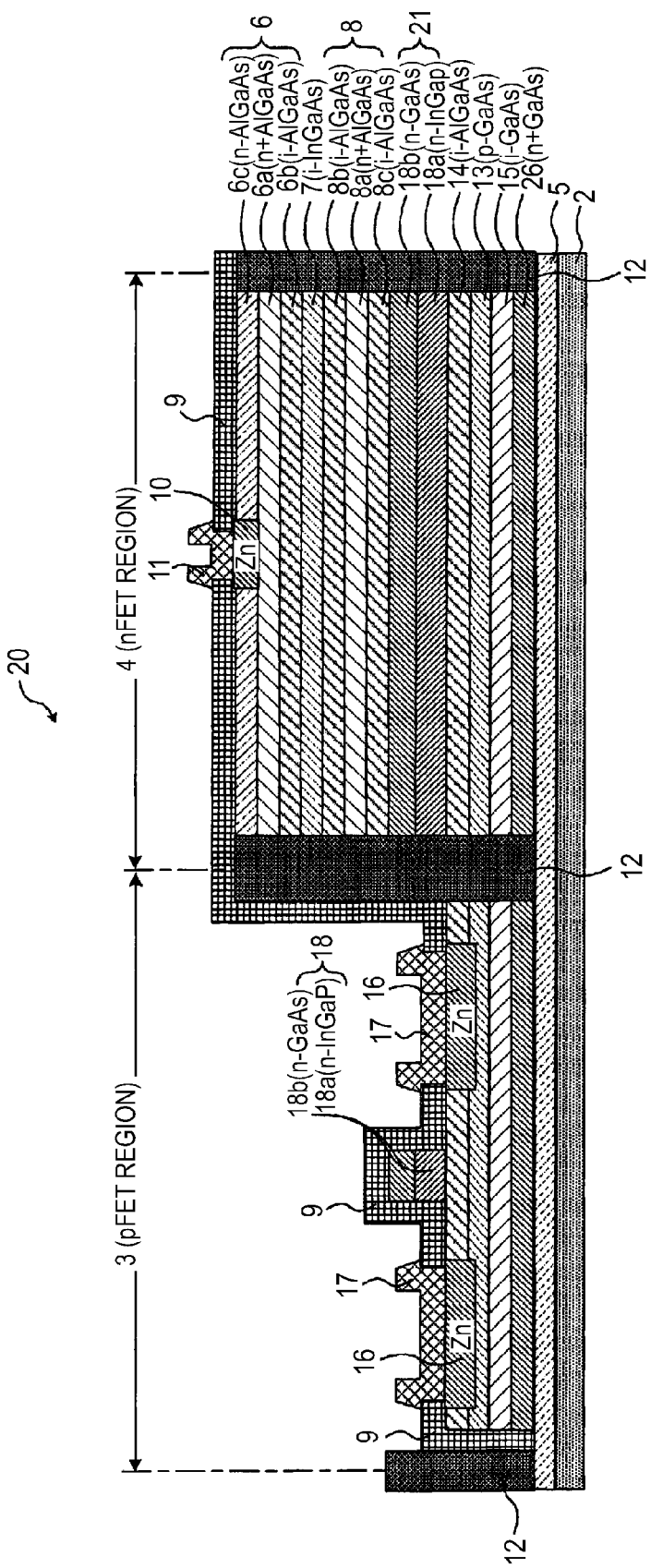
FIG. 2 is a schematic longitudinal sectional view of a semiconductor device according to another embodiment of the present invention.

FIG. 2 is a schematic longitudinal sectional view of a semiconductor device 20 according to Second Embodiment of the present invention. Like numerals represent like members or members with similar functions.

The semiconductor device 20 includes a pFET region 3 and an nFET region 4 formed on a compound semiconductor substrate 2. The pFET region 3 is described first. A first buffer layer 5 of GaAs with no impurities is formed on the compound semiconductor substrate 2 of GaAs monocrystals. A cap layer 26 of n⁺GaAs doped with n-type impurities, and a second buffer layer 15 of i-GaAs with no impurities are formed on the first buffer layer 5. A second channel layer 13 of p⁻GaAs doped with p-type impurities is formed thereon.

A gate-leak prevention layer 14 of i-AlGaAs with no impurities is formed on the second channel layer 13. On the gate-leak prevention layer 14 is formed an n-type gate region 18 of a bilayer structure that includes an n-type first gate layer 18a of n⁻InGaP doped with n-type impurities, and an n-type second gate layer 18b of n⁻GaAs doped with n-type impurities. Source and drain regions 16 are separated from each other with the n-type gate region 18 in between, and extend to a portion of the second channel layer 13 through the gate-leak prevention layer 14. The source and drain regions 16 are diffused regions in portions of the gate-leak prevention layer 14 and the second channel layer 13 where Zn impurities have been diffused.

An insulating film (silicon nitride film) 9 is formed on the side surfaces of the second buffer layer 15, the second channel layer 13, the gate-leak prevention layer 14, and the n-type gate region 18, and on the surfaces of the gate-leak prevention layer 14 and the n-type gate region 18. The insulating film 9 has opening portions used to diffuse Zn in the source and drain regions 16, and metallic source and drain electrodes 17 are formed in the opening portions. These electrodes have an ohmic contact with the underlying, source and drain regions 16. The insulating film 9 is also formed on the side surface where the nFET region 4 is not formed, specifically on the side surfaces of the second buffer layer 15, the second channel layer 13, and the gate-leak prevention layer 14.

The nFET region 4 is described below. A laminate structure of the first buffer layer 5, the second buffer layer 15, the second channel layer 13, the gate-leak prevention layer 14, the n-type first gate layer 18a, and the n-type second gate layer 18b is formed on the compound semiconductor substrate 2 as with the laminate structure in the pFET region 3. On the laminate structure is formed an n-type second barrier layer 8 of a three-layer structure that includes a high-resistance layer 8c of i-AlGaAs with no impurities, an n-type charge supply layer 8a of n⁺AlGaAs doped with high-concentration n-type impurities, and a high-resistance layer 8b of i-AlGaAs with no impurities. A first channel layer 7 of i-InGaAs with no impurities is formed thereon. On the first channel layer 7 is formed an n-type first barrier layer 6 of a three-layer structure that includes a high-resistance layer 6b of i-AlGaAs with no impurities, an n-type charge supply layer 6a of n+AlGaAs doped with high-concentration n-type impurities, and a high-resistance layer 6c of n−AlGaAs doped with n-type impurities.

A p-type gate region 10 is a Zn-diffused p-type region in the n−AlGaAs high-resistance layer 6c. The insulating film (silicon nitride film) 9 is formed on the upper surface of the high-resistance layer 6c, and an opening portion used to diffuse Zn in the p-type gate region 10 is formed through the insulating film 9. A gate electrode 11 is formed in the opening portion. The gate electrode 11 is a metal electrode that includes sequentially laminated titanium (Ti), platinum (Pt), and gold (Au), and has an ohmic contact with the underlying, p-type gate region 10. Though not illustrated in FIG. 2, a source electrode and a drain electrode are formed on the both sides of the gate electrode 11. These electrodes have an ohmic contact with the high-resistance layer 6c.

An element isolation region 12 is a boundary region for the pFET region 3 and the nFET region 4, and is formed through the n-type second barrier layer 8, the first channel layer 7, and the n-type first barrier layer 6. The element isolation region 12 is also formed on the surface of the insulating film 9 formed on the side surface of the pFET region 3, and on the side surface of the nFET region 4, specifically on the side surfaces of the second buffer layer 15, the second channel layer 13, the gate-leak prevention layer 14, the n-type gate layer 21, the n-type second barrier layer 8, the first channel layer 7, and the n-type first barrier layer 6. Further, the insulating film 9 is also formed on the exposed surface of the element isolation region 12 formed in the boundary region of the pFET region 3 and the nFET region 4.

The thickness of each layer, the impurity material of the layer containing impurity, and the impurity concentration are the same as in First Embodiment.

Third Embodiment

A manufacturing method of a semiconductor device 1 according to Third Embodiment of the present invention is described below with reference to FIG. 3 to FIG. 11. Like numerals represent like members or members with similar functions.

Figure 3:
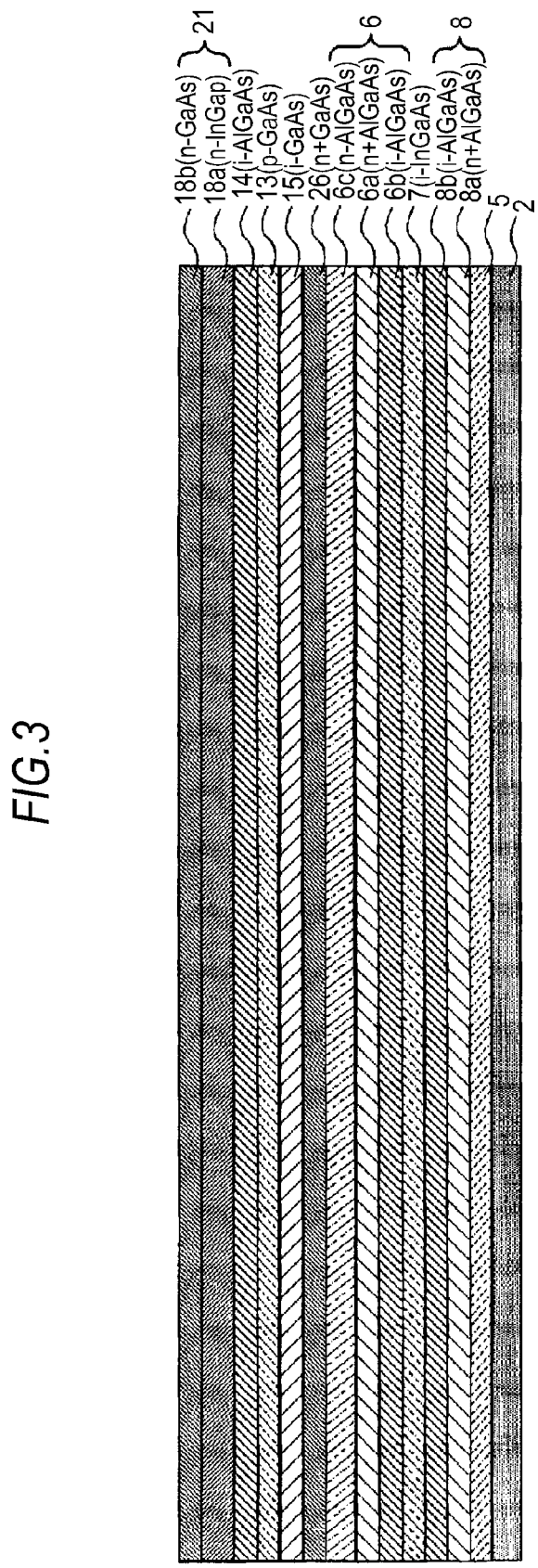
FIG. 3 is a schematic view representing a semiconductor device manufacturing method according to an embodiment of the present invention.

FIG. 3 is a schematic longitudinal sectional view representing a laminate structure formed by the epitaxial growth of layers of primarily GaAs material on a GaAs monocrystalline substrate using, for example, a MOCVD (Metal Organic Chemical Vapor Deposition) method. A GaAs layer with no impurities is epitaxially grown on a compound semiconductor substrate 2 of GaAs monocrystals to form a first buffer layer 5 of about 200 nm thick. Then, an n+AlGaAs layer doped with the n-type impurity Si at a high concentration of $1.0 \times 10^{12}$ to $4.0 \times 10^{12}$ atoms/cm$^2$, for example, $3.0 \times 10^{12}$ atoms/cm$^2$ is epitaxially grown on the first buffer layer 5 to form an n-type charge supply layer 8a of about 3 nm thick. This is followed by the epitaxial growth of a i-AlGaAs layer with no impurities to form a high-resistance layer 8b in a thickness of about 3 nm. The n-type charge supply layer 8a and the high-resistance layer 8b form an n-type second barrier layer 8. The composition ratio of aluminum in the n-type second barrier layer 8 is 0.2 to 0.3, for example, $Al_{0.2}Ga_{0.8}As$.

Then, a i-InGaAs layer with no impurities is epitaxially grown on the n-type second barrier layer 8 to form a first channel layer 7 of about 5 nm to 15 nm thick. The composition ratio of indium (In) in the first channel layer 7 is 0.1 to 0.4, for example, $In_{0.2}Ga_{0.8}As$, so as to provide a narrower band gap than that of the n-type second barrier layer 8.

Thereafter, a i-AlGaAs layer with no impurities is epitaxially grown on the first channel layer 7 to form a high-resistance layer 6b of about 2 nm thick. Then, an n+AlGaAs layer doped with the n-type impurity Si at a high concentration of $1.0 \times 10^{12}$ to $4.0 \times 10^{12}$ atoms/cm$^2$ is epitaxially grown to form an n-type charge supply layer 6a of about 6 nm thick. An n−AlGaAs layer doped with the n-type impurity Si at low concentration is then epitaxially grown to form a high-resistance layer 6c of 70 nm to 200 nm thick. The high-resistance layer 6b, the n-type charge supply layer 6a, and the high-resistance layer 6c form an n-type first barrier layer 6. The composition ratio of aluminum in the n-type first barrier layer 6 is 0.2 to 0.3, for example, $Al_{0.2}Ga_{0.8}As$, so as to provide a wider band gap than that of the first channel layer 7.

Next, an n+GaAs film doped with n-type impurities at $6 \times 10^{18}$ atoms/cm$^3$ is epitaxially grown on the n-type first barrier layer 6 to form a cap layer 26. Then, a i-GaAs layer with no impurities is epitaxially grown to form a second buffer layer 15 of 10 nm to 100 nm thick.

Thereafter, a p−GaAs layer doped with p-type impurities, for example, such as C at a concentration of $1 \times 10^{16}$ to $5 \times 10^{18}$ atoms/cm$^3$ is epitaxially grown on the second buffer layer 15 to form a second channel layer 13 of 30 nm to 250 nm thick. This is followed by the epitaxial growth of a i-AlGaAs layer with no impurities to form a gate-leak prevention layer 14 of 0 to 50 nm thick. The zero thickness means that the gate-leak prevention layer 14 is not an essential component. The composition ratio of aluminum in the gate-leak prevention layer 14 is 0.2 to 0.3, for example, $Al_{0.2}Ga_{0.8}As$.

Then, an n−InGaP layer doped with n-type impurities such as Si at a concentration of $1 \times 10^{17}$ to $5 \times 10^{19}$ atoms/cm$^3$ is epitaxially grown on the gate-leak prevention layer 14 or the second channel layer 13 to form an n-type first gate layer 18a of 10 nm to 50 nm thick. Thereafter, an n−GaAs layer doped with n-type impurities such as Si at $1 \times 10^{17}$ to $5 \times 10^{19}$ atoms/cm$^3$ is epitaxially grown to form an n-type second gate layer 18b of 50 to 200 nm thick. The n-type first gate layer 18a and the n-type second gate layer 18b form an n-type gate layer 21. In these steps, the epitaxial growth is performed at a temperature of about 600° C.

Figure 4:
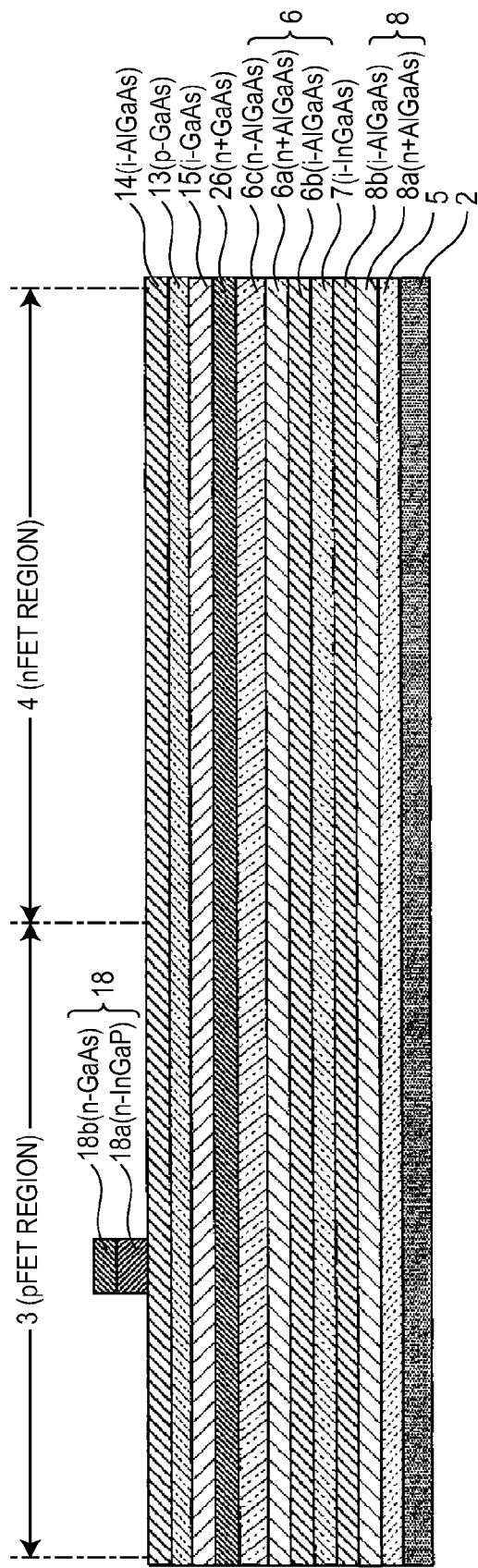
FIG. 4 is a schematic view representing the semiconductor device manufacturing method according to an embodiment of the present invention.
Figure 5:
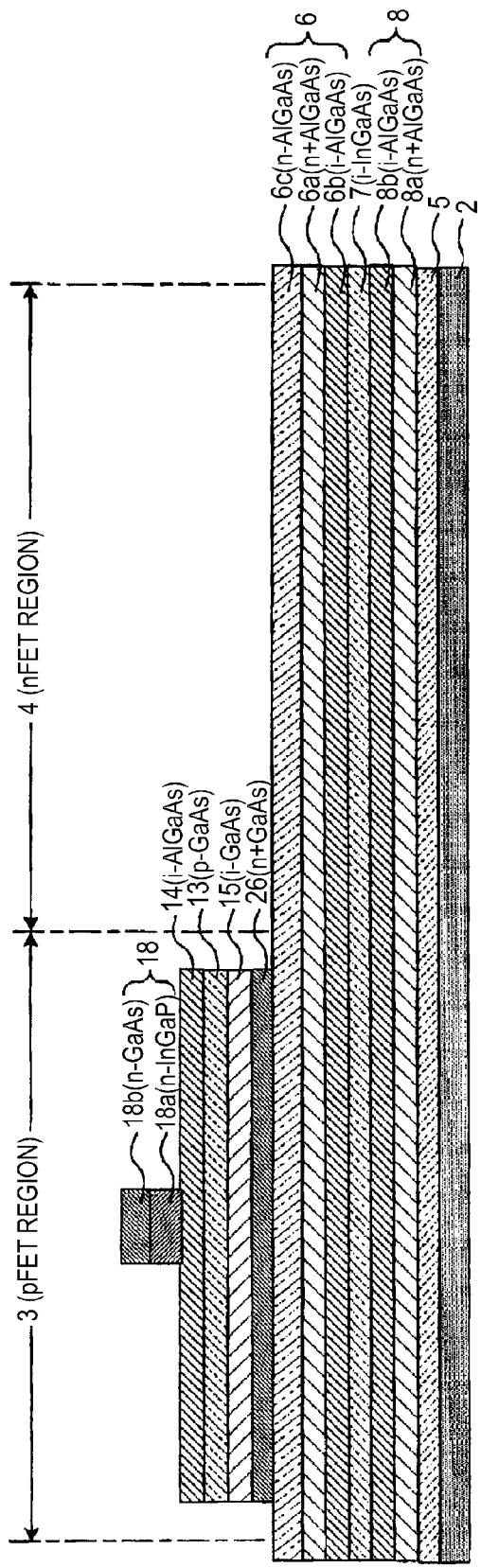
FIG. 5 is a schematic view representing the semiconductor device manufacturing method according to an embodiment of the present invention.

Next, as illustrated in FIG. 4, the n-type second gate layer 18b and the n-type first gate layer 18a are selectively removed by etching to form an n-type gate region 18 in the pFET region 3. The n-type gate region 18 is maintained using a photolithography technique and wet or dry etching. Then, as illustrated in FIG. 5, the gate-leak prevention layer 14, the second channel layer 13, the second buffer layer 15, and the cap layer 26 are sequentially removed by selective etching. The removed region becomes the nFET region 4, and the remaining region becomes the pFET region 3.

Figure 6:
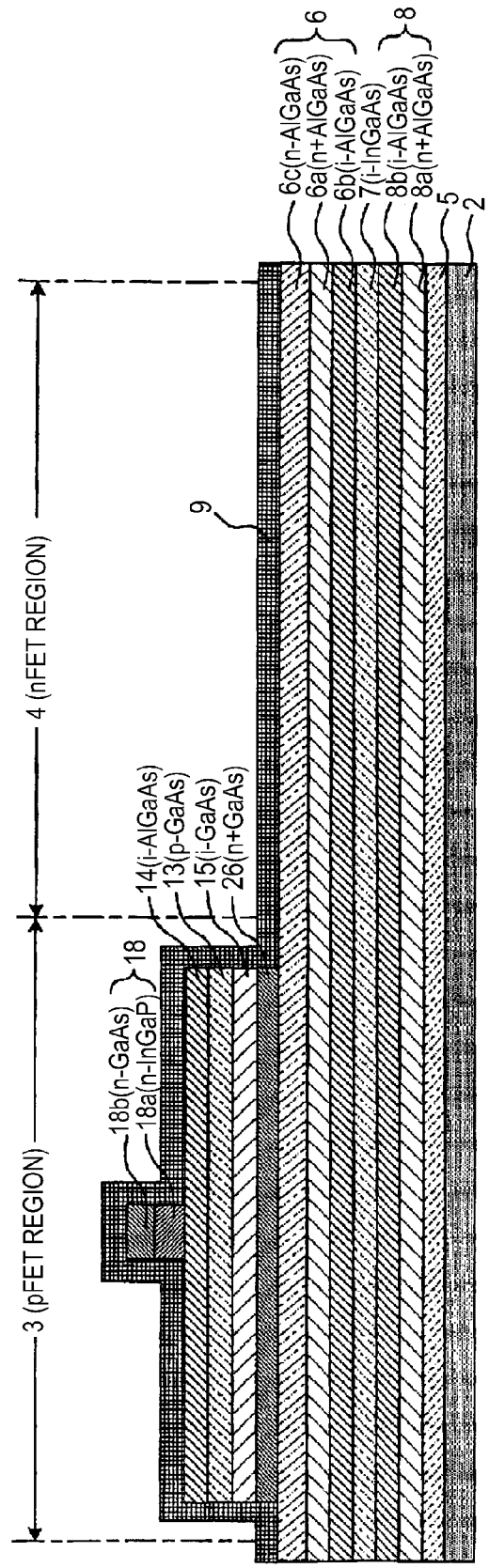
FIG. 6 is a schematic view representing the semiconductor device manufacturing method according to an embodiment of the present invention.
Figure 7:
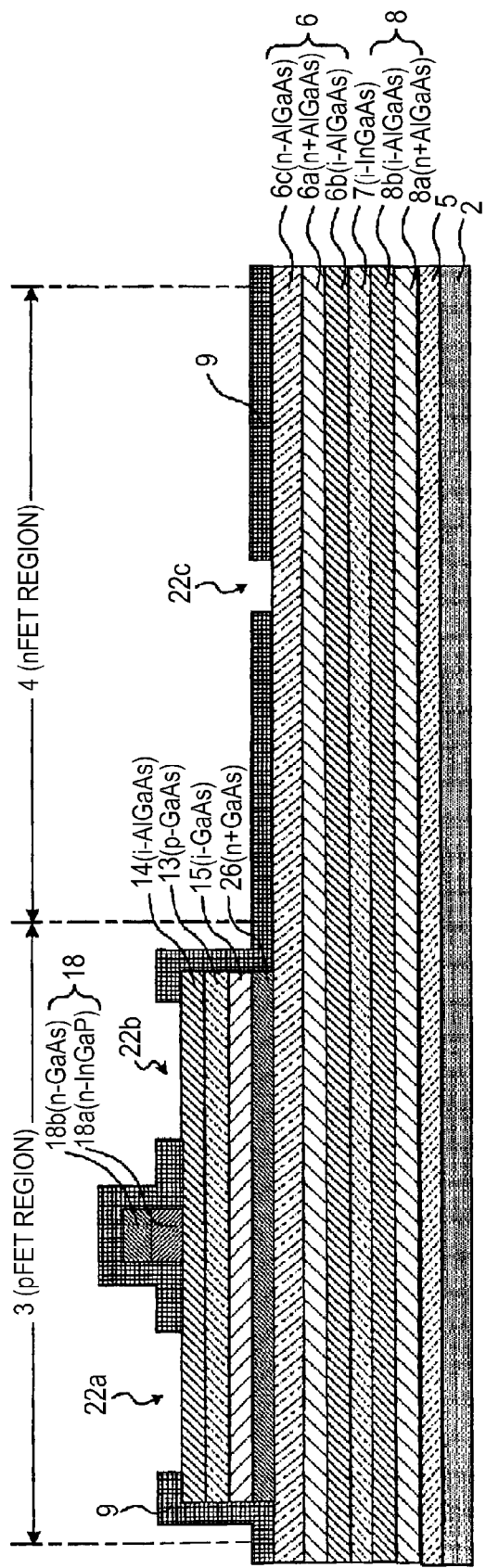
FIG. 7 is a schematic view representing the semiconductor device manufacturing method according to an embodiment of the present invention.

Next, as illustrated in FIG. 6, an insulating film (silicon nitride film) 9 is formed in a thickness of 100 nm to 500 nm on the exposed upper surface of the substrate, using a plasma CVD method. Then, as illustrated in FIG. 7, first opening portions 22a and 22b for the source and drain regions of the pFET region 3, and a first opening portion 22c for the gate region of the nFET region 4 are formed through the insulating film 9. The first opening portions 22a, 22b, and 22c are formed by using a photolithography technique, and by anisotropic etching that employs, for example, a RIE (Reactive Ion Etching) technique.

Figure 8:
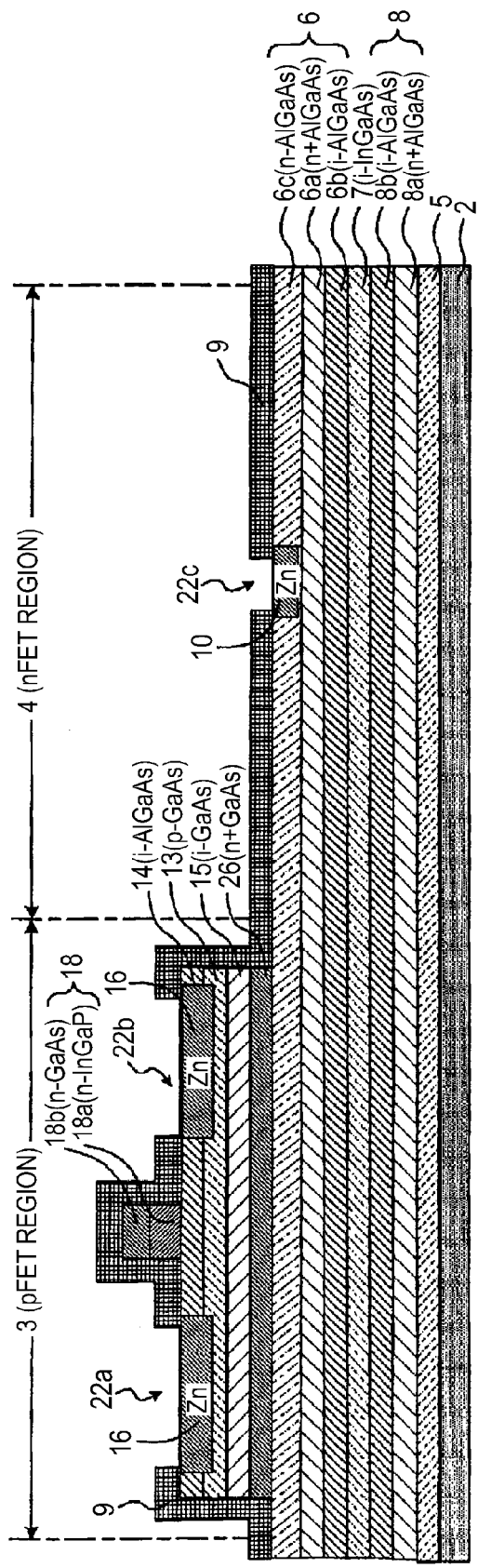
FIG. 8 is a schematic view representing the semiconductor device manufacturing method according to an embodiment of the present invention.

Thereafter, as illustrated in FIG. 8, Zn is diffused through the gate-leak prevention layer 14 and down halfway into the second channel layer 13 in the thickness direction through the first opening portions 22a and 22b of the insulating film 9, and simultaneously halfway into the high-resistance layer 6c in the thickness direction through the first opening portion 22c. As a result, p-type source and drain regions 16 and a p-type gate region 10 are formed in the pFET region 3 and an nFET region 4, respectively. The introduction and diffusion of Zn through the first opening portions 22a, 22b, and 22c is performed by heating the substrate to about 600° C. in a gas atmosphere that contains diethylzinc ($Zn(C_2H_5)_2$) and arsine ($AsH_3$). The Zn diffusion through the first opening portion 22c in the nFET region 4 should preferably proceed to a depth distant apart from the upper surface of the first channel layer 7 by at least about 10 nm. Note that Zn can be injected using an ion implantation method.

Figure 9:
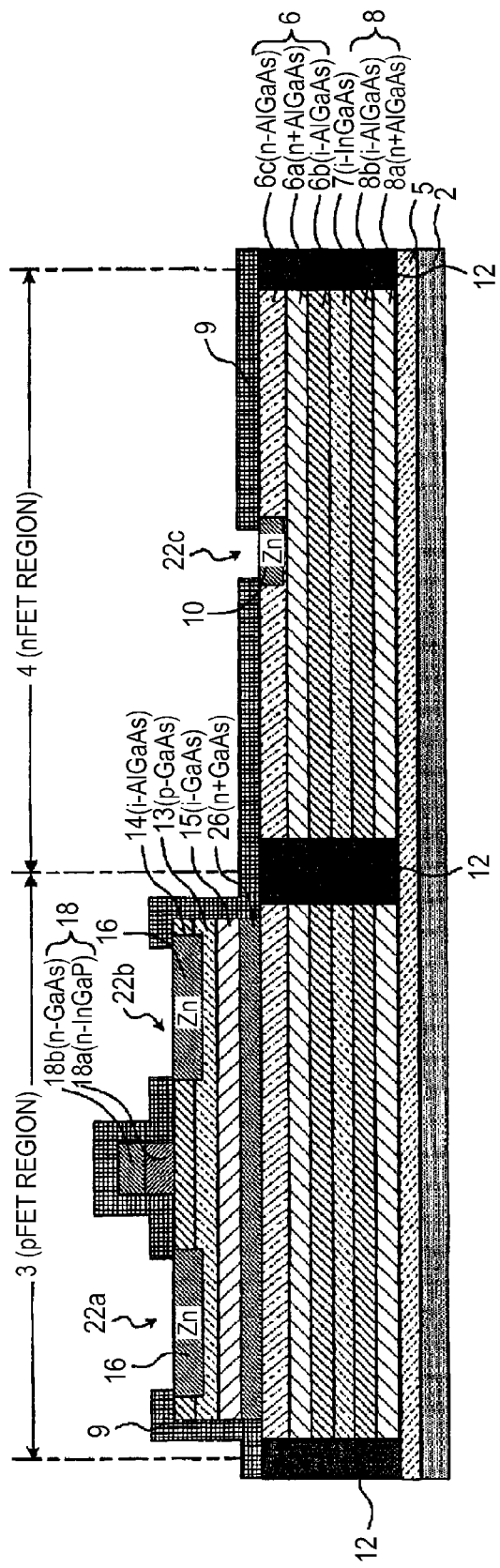
FIG. 9 is a schematic view representing the semiconductor device manufacturing method according to an embodiment of the present invention.

Next, as illustrated in FIG. 9, the element isolation region 12 is formed that electrically separates the pFET region 3 and the nFET region 4 from each other. The element isolation region 12 is formed down to the bottom of the n-type second barrier layer 8 through the n-type first barrier layer 6 and the first channel layer 7. The element isolation region 12 can be formed by, for example, the ion implantation of B ions.

Figure 10:
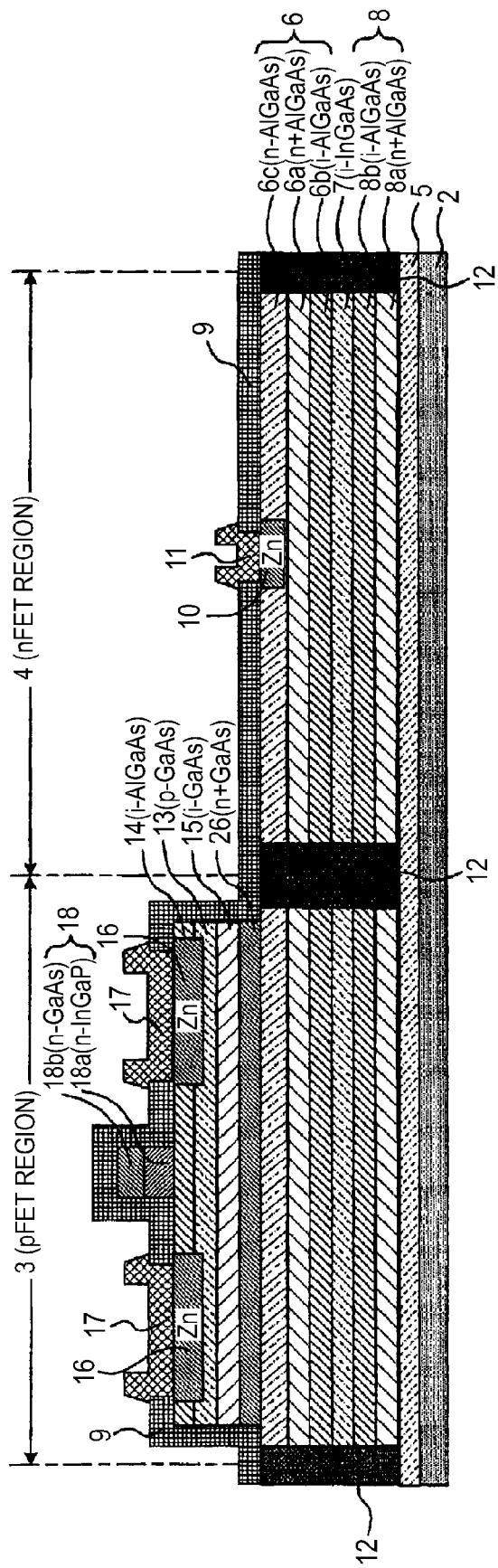
FIG. 10 is a schematic view representing the semiconductor device manufacturing method according to an embodiment of the present invention.

Thereafter, as illustrated in FIG. 10, a metal film is deposited on the substrate surface, and selectively removed using a photolithography technique and an etching technique to simultaneously form source and drain electrodes 17 in the pFET region 3, and a gate electrode 11 in the nFET region 4. For example, the metal film is formed by depositing titanium (Ti), platinum (Pt), and gold (Au) in thicknesses of 30 nm, 50 nm, 120 nm, respectively, using an electron beam deposition method. As a result, an ohmic contact is made in each of the Zn-diffused p-type source and drain regions 16, and the Zn-diffused p-type gate region 10.

Figure 11:
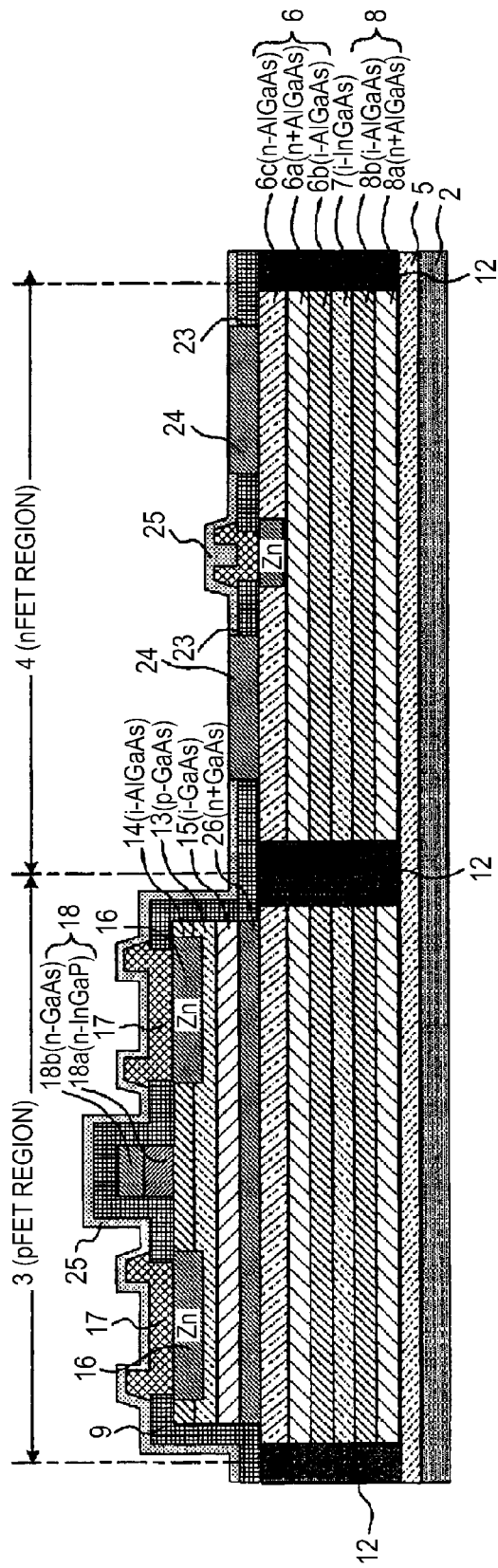
FIG. 11 is a schematic view representing the semiconductor device manufacturing method according to an embodiment of the present invention.

Further, as illustrated in FIG. 11, a protective film 25 made of insulating material is deposited on the substrate surface, and second opening portions 23 are formed in the protective film 25 and the insulating film 9 on the both sides of the gate electrode 11 in the nFET region 4. Then, a gold-germanium (AuGe) alloy and nickel (Ni) are deposited on the substrate surface in thicknesses of about 160 nm and about 40 nm, respectively, using a resistive heating method, and are selectively removed using a photolithography technique and an etching technique to form source and drain electrodes 24. The source and drain electrodes 24 have an ohmic contact with the n-type high-resistance layer 6c. When forming the second opening portions 23 in the protective film 25 and the insulating film 9, an opening portion may be simultaneously formed over the n-type gate region 18 of the pFET region 3 to form a gate electrode for the pFET region 3, simultaneously with the source and drain electrodes 24 for the nFET region 4.

Third Embodiment described a manufacturing method in which the p-channel FET and the n-channel FET of the structures described in FIG. 1 are simultaneously formed. However, the p-channel FET and the n-channel FET of the structures described in FIG. 2 also can be formed simultaneously in the same manner.

Fourth Embodiment

A manufacturing method of a semiconductor device 20 according to Fourth Embodiment of the present invention is described below. A first buffer layer (GaAs layer) 5 is epitaxially grown on a compound semiconductor substrate 2 of GaAs monocrystals. This is followed by the epitaxial growth of a cap layer 26 of $n^+$GaAs doped with high-concentration n-type impurities, and a second buffer layer 15 of i-GaAs with no impurities. Then, a second channel layer 13 of $p^-$GaAs doped with p-type impurities, and a gate-leak prevention layer 14 of i-AlGaAs with no impurities are epitaxially grown. Thereafter, an n-type first gate layer 18a of $n^-$InGaP doped with low-concentration n-type impurities, and an n-type second gate layer 18b of $n^-$GaAs doped with n-type impurities are epitaxially grown sequentially to form an n-type gate layer 21.

Next, an n-type second barrier layer 8 is formed that includes a high-resistance layer 8c of i-AlGaAs with no impurities, an n-type charge supply layer 8a of $n^+$AlGaAs doped with high-concentration n-type impurities, and a high-resistance layer 8b of i-AlGaAs with no impurities. This is followed by the epitaxial growth of a first channel layer 7 of i-InGaAs with no impurities. Then, a high-resistance layer 6b of i-AlGaAs with no impurities, an n-type charge supply layer 6a of $n^+$AlGaAs doped with high-concentration n-type impurities, and a high-resistance layer 6c of $n^-$AlGaAs doped with low-concentration n-type impurities are epitaxially grown sequentially to form an n-type first barrier layer 6. The thickness of each layer, the impurity material of the layer containing impurity, and the impurity concentration are the same as in Third Embodiment.

Next, an element isolation region 12 is formed to electrically separate the pFET region 3 and the nFET region 4 from each other, and the n-type first barrier layer 6, the first channel layer 7, and the n-type second barrier layer 8 in the pFET region 3 are selectively removed. Then, the n-type gate layer 21 in the pFET region 3 is selectively removed to form an n-type gate region 18 having an laminate structure of the n-type first gate layer 18a and the n-type second gate layer 18b.

Thereafter, an insulating film (silicon nitride film) 9 is deposited on the surfaces of the n-type first barrier layer 6 and the gate-leak prevention layer 14, and on the surface of the element isolation region 12. Then, opening portions for the source and drain regions of the pFET region 3, and for the gate region of the nFET region 4 are formed. Through the opening portions, Zn p-type impurities are introduced into the gate-leak prevention layer 14, the second channel layer 13, and the high-resistance layer 6c. As a result, source and drain regions 16, and a p-type gate region 10 are simultaneously formed in the pFET region 3 and the nFET region 4, respectively.

Then, a metal film is deposited and selectively removed to simultaneously form source and drain electrodes 17 and a gate electrode 11 in the pFET region 3 and the nFET region 4, respectively. The gate electrode of the pFET region 3, and the source and drain electrodes of the nFET region 4 can be simultaneously formed as in Third Embodiment. Further, the impurity concentration and thickness of each layer formed by epitaxial growth, the introduction and diffusion of Zn, the compositions and thicknesses of the source electrode, the drain electrode, and the gate electrode may be the same as those in Third Embodiment.

Fifth Embodiment

Figure 12:
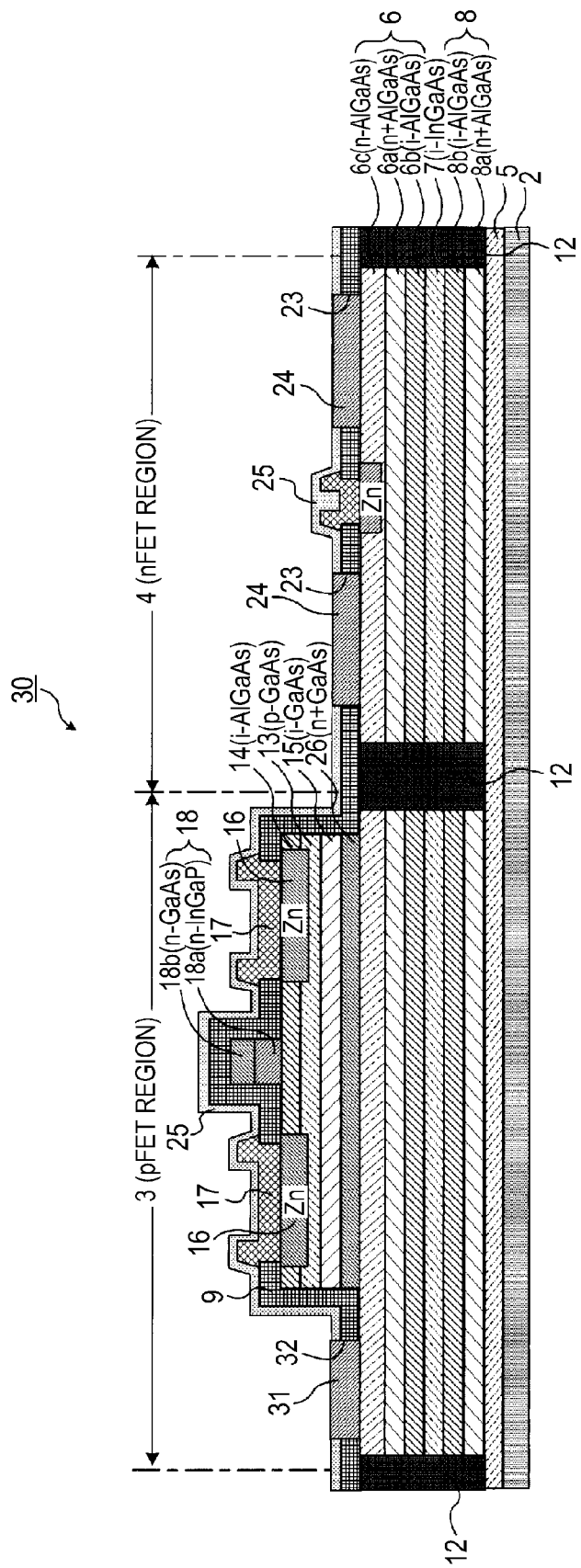
FIG. 12 is a schematic longitudinal sectional view of a semiconductor device according to yet another embodiment of the present invention.

FIG. 12 is a schematic longitudinal sectional view of a semiconductor device 30 according to Fifth Embodiment of the present invention. Like numerals represent like members or members with similar functions. Further, the thickness of each layer, the impurity material of the layer containing impurity, and the impurity concentration are the same as in First Embodiment, except for the backgate electrode 31 described later.

The semiconductor device 30 according to Fifth Embodiment differs from the semiconductor device 1 of First Embodiment in that it further includes a backgate electrode 31 in the pFET region 3. The provision of the backgate electrode 31 in the p-channel FET increases transconductance, and thus improves the ON/OFF characteristic of the p-channel FET.

As illustrated in FIG. 12, the semiconductor device 30 includes a pFET region 3 and an nFET region 4 on the compound semiconductor substrate 2. The nFET region 4 will not be described because it is no different from the nFET region 4 of the semiconductor device 1 according to First Embodiment.

In the pFET region 3, a first buffer layer 5 of GaAs with no impurities is formed on the compound semiconductor substrate 2 of GaAs monocrystals. An n-type second barrier layer 8, a first channel layer 7, an n-type first barrier layer 6, a cap layer 26, a second buffer layer 15, and a second channel layer 13 are sequentially formed on the first buffer layer 5. A gate-leak prevention layer 14, and source and drain regions 16 are formed on the second channel layer 13. The source and drain regions 16 are Zn impurity-diffused regions in portions of the gate-leak prevention layer 14 and the second channel layer 13. The gate-leak prevention layer 14 may be omitted. The pFET region 3 and the nFET region 4 are electrically separated from each other by the element isolation region 12.

An n-type gate region 18 is formed on the gate-leak prevention layer 14, and thus has a pn junction-type potential barrier against the second channel layer 13. This enables driving in an enhancement mode in which the gate voltage applied to the gate is lower than that in a Schottky-type gate field-effect transistor.

Further, in the pFET region 3 of the semiconductor device 30, the backgate electrode 31 is formed on the n-type first barrier layer 6. The backgate electrode 31 may have, for example, a bilayer structure of a gold-germanium (AuGe) alloy and nickel (Ni). The backgate electrode 31 is electrically connected to an n-type gate region 18, though not illustrated.

The backgate electrode 31 can be formed at the time of forming source and drain electrodes 24 for the n-channel FET. Accordingly, no additional step is required, and a resist mask is not necessary.

Figure 13:
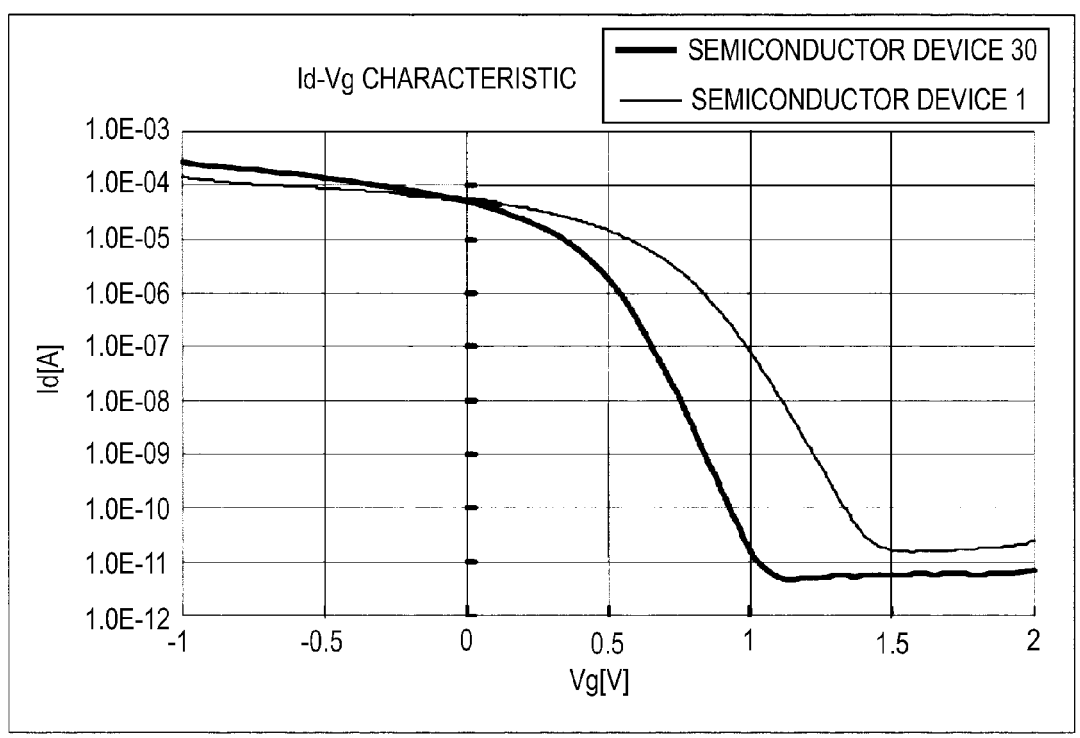
FIG. 13 is a diagram representing a characteristic of the semiconductor device according to yet another embodiment of the present invention.

Measurement was made concerning the Id-Vg characteristic of the p-channel FET of the semiconductor device 1 according to First Embodiment, and that of the p-channel FET of the semiconductor device 30 of the presently described Fifth Embodiment. The results are shown in FIG. 13. Note that the gate width is 10 μm.

It can be seen in FIG. 13 that the p-channel FET of the semiconductor device 30 according to Fifth Embodiment has a better p-channel FET on/off characteristic than the p-channel FET of the semiconductor device 1 of First Embodiment.

For example, in the p-channel FET of the semiconductor device 1 according to First Embodiment, the drain current Id is $4.71 \times 10^{-5}$ (A) for the gate voltage Vg of 0 V (ON state), and $8.23 \times 10^{-8}$ (A) for the gate voltage Vg of 1 V (OFF state). In contrast, in the p-channel FET of the semiconductor device 30 according to Fifth Embodiment, the drain current Id is $5.05 \times 10^{-5}$ (A) for the gate voltage Vg of 0 V (ON state), and $1.75 \times 10^{-11}$ (A) for the gate voltage Vg of 1 V (OFF state).

Further, the p-channel FET of the semiconductor device 30 according to Fifth Embodiment has a higher drain current Id at the gate voltage Vg of 1.5 V, and a lower drain current Id at the gate voltage Vg of −1 V than the p-channel FET of the semiconductor device 1 of First Embodiment.

Furthermore, in the p-channel FET of the semiconductor device 30 of Fifth Embodiment, the drain current Id varies with the gate voltage Vg at a greater rate than in the p-channel FET of the semiconductor device 1 of First Embodiment.

In this manner, by the provision of the backgate electrode 31 in the p-channel FET, the on/off characteristic of the p-channel FET can be improved.

Although there are a number of possible layout methods for the backgate electrode 31, the same effect can be obtained regardless of the layout, as long as the backgate electrode 31 is formed near regions of the p-channel FET where the n-type gate region 18 and the source and drain regions 16 are formed.

A manufacturing method of the semiconductor device 30 according to Fifth Embodiment is described below.

First, the steps represented in FIG. 3 and FIG. 4 are performed as in Third Embodiment. These steps are the same as in Third Embodiment, and thus will not be described.

Figure 14:
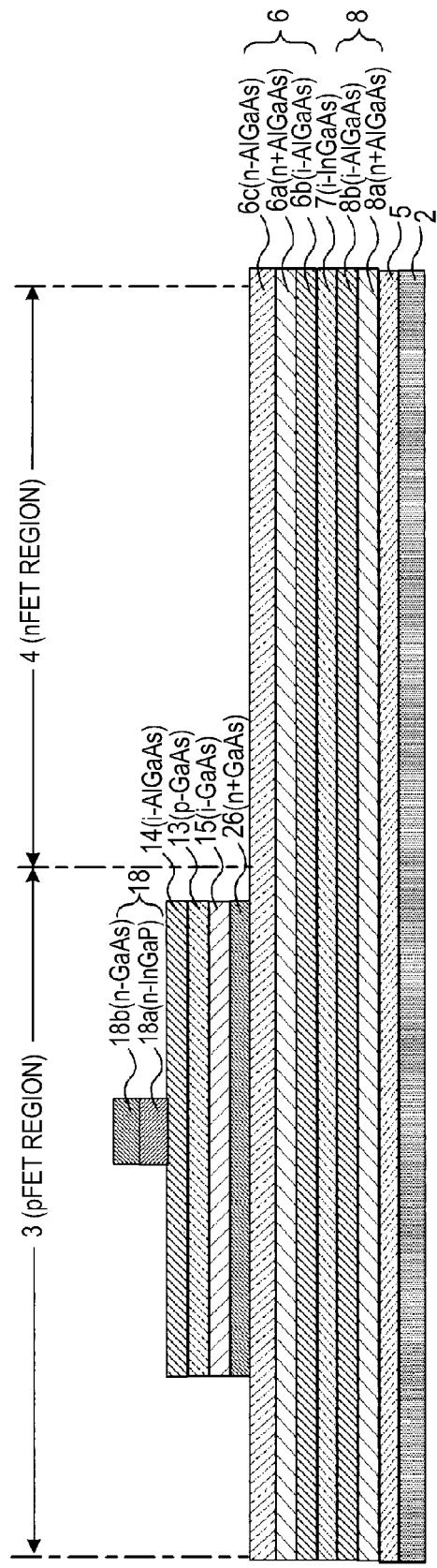
FIG. 14 is a schematic view representing a manufacturing method of the semiconductor device according to yet another embodiment of the present invention.

As illustrated in FIG. 14, the gate-leak prevention layer 14, the second channel layer 13, the second buffer layer 15, and the cap layer 26 are sequentially removed by selective etching in a region of the pFET region 3 where the backgate electrode 31 is to be formed (see FIG. 12), and in the nFET region 4.

Next, the steps represented in FIG. 6 to FIG. 10 are performed as in Third Embodiment. These steps are the same as in Third Embodiment, and thus will not be described.

Figure 15:
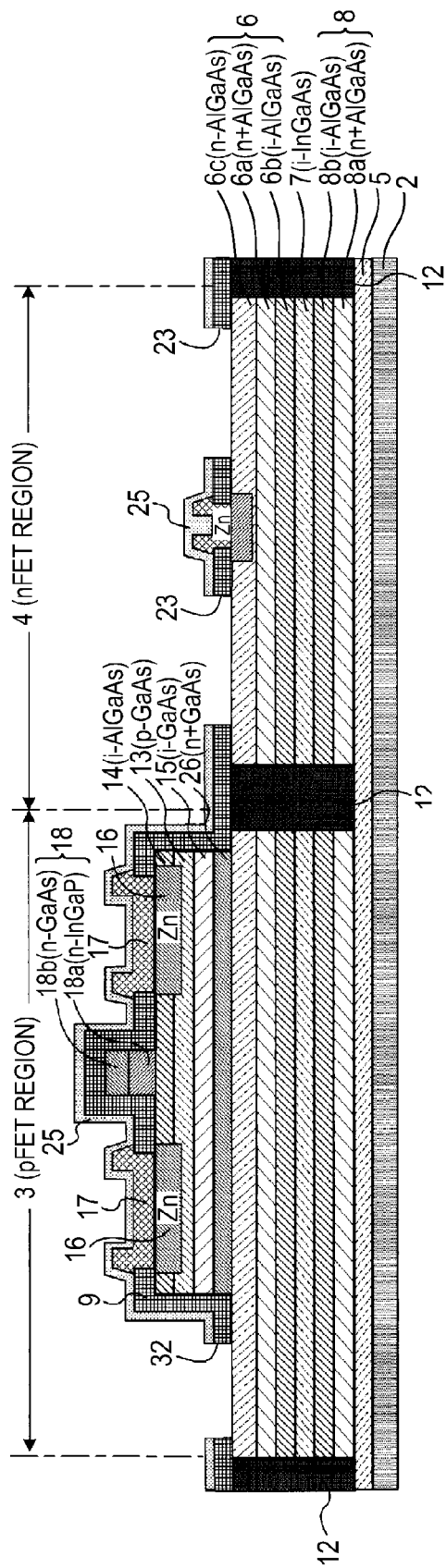
FIG. 15 is a schematic view representing a manufacturing method of the semiconductor device according to yet another embodiment of the present invention.

Then, as illustrated in FIG. 15, a protective film 25 of insulating material is deposited on the substrate surface, and second opening portions 23 are formed in the protective film 25 and the insulating film 9 on the both sides of the gate electrode 11 in the nFET region 4. Simultaneously, a third opening portion 32 is formed in the protective film 25 and the insulating film 9 formed on the n-type high-resistance layer 6c of the n-type first barrier layer 6 in the pFET region 3.

Then, a gold-germanium (AuGe) alloy and nickel (Ni) are deposited on the substrate surface in thicknesses of about 160 nm and about 40 nm, respectively, using a resistive heating method, and are selectively removed using a photolithography technique and an etching technique to simultaneously form the source and drain electrodes 24 and the backgate electrode 31. As a result, the p-channel FET illustrated in FIG. 12 is formed. The source and drain electrodes 24 have an ohmic contact with the n-type high-resistance layer 6c. The backgate electrode 31 also has an ohmic contact with the n-type high-resistance layer 6c. When forming the second opening portions 23 in the protective film 25 and the insulating film 9, an opening portion may be simultaneously formed over the n-type gate region 18 of the pFET region 3 to form the gate electrode for the pFET region 3, simultaneously with the source and drain electrodes 24 for the nFET region 4.

The backgate electrode 31 can be formed at the time of forming the source and drain electrodes 24. Accordingly, no additional step is required, and a resist mask is not necessary.

Sixth Embodiment

Figure 16:
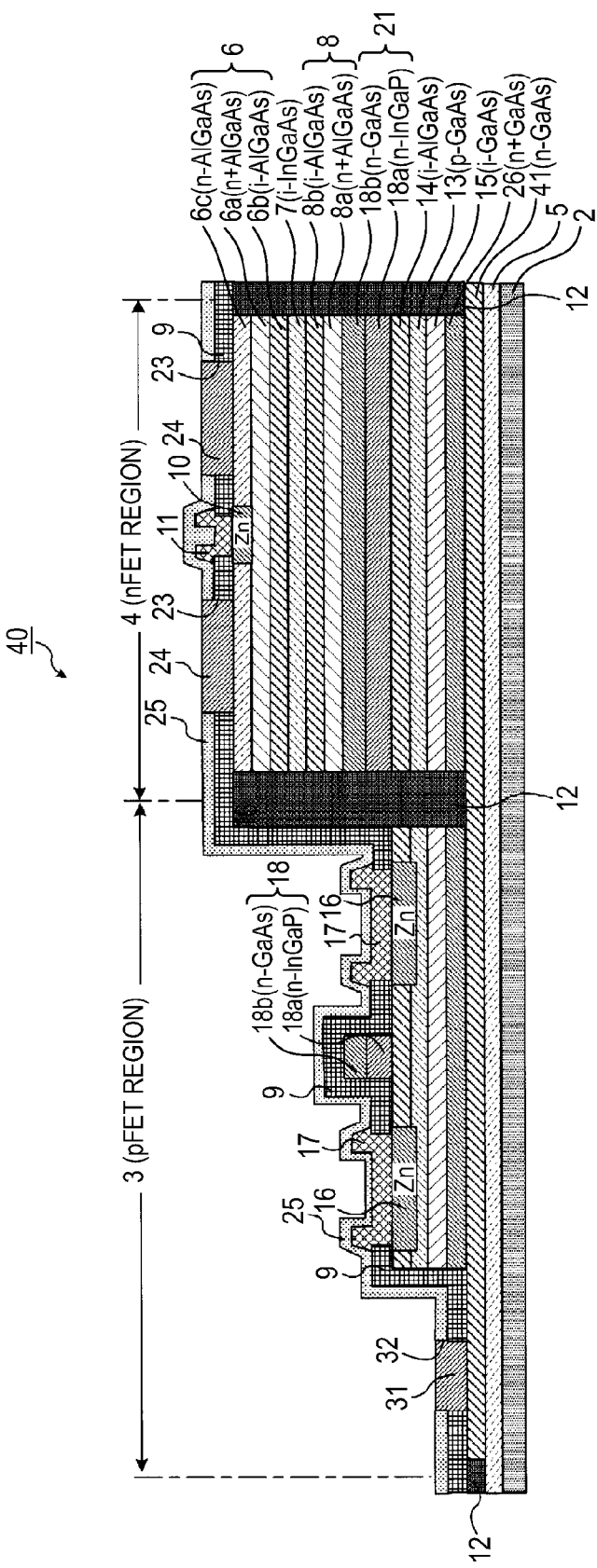
FIG. 16 is a schematic longitudinal sectional view of a semiconductor device according to still another embodiment of the present invention.

FIG. 16 is a schematic longitudinal sectional view of a semiconductor device 40 according to Sixth Embodiment of the present invention. Like numerals represent like members or members with similar functions. Further, the thickness of each layer, the impurity material of the layer containing impurity, and the impurity concentration are the same as in Second Embodiment, except for the backgate electrode 31 and the n⁻GaAs layer 41 described later.

The semiconductor device 40 according to Sixth Embodiment differs from the semiconductor device 20 according to Second Embodiment in that an n⁻GaAs layer 41 is formed between the first buffer layer 5 and the cap layer 26, and that a backgate electrode 31 is formed on the n⁻GaAs layer 41 in the pFET region 3. The provision of the backgate electrode 31 in the p-channel FET increases transconductance, and thus improves the ON/OFF characteristic of the p-channel FET.

As illustrated in FIG. 16, the semiconductor device 40 includes a pFET region 3 and an nFET region 4 formed on the compound semiconductor substrate 2. The nFET region 4 will not be described because it is no different from the nFET region of the semiconductor device 10 according to Second Embodiment.

In the pFET region 3, a first buffer layer 5 of GaAs with no impurities is formed on the compound semiconductor substrate 2 of GaAs monocrystals. Then n⁻GaAs layer 41 of n⁻GaAs doped with the n-type impurity Si at a low concentration of $1.0 \times 10^{10}$ to $4.0 \times 10^{11}$ atoms/cm² is formed on the first buffer layer 5.

A cap layer 26, a second buffer layer 15, and a second channel layer 13 are sequentially formed on the n⁻GaAs layer 41, as in the semiconductor device 20. A gate-leak prevention layer 14 and source and drain regions 16 are formed on the second channel layer 13. The source and drain regions 16 are Zn impurity-diffused region in portions of the gate-leak prevention layer 14 and the second channel layer 13. The gate-leak prevention layer 14 may be omitted. The pFET region 3 and the nFET region 4 are electrically separated from each other by the element isolation region 12.

In the semiconductor device 40, the backgate electrode 31 is formed on the n-type first barrier layer 6. The backgate electrode 31 can have, for example, a bilayer structure of a gold-germanium (Aute) alloy and nickel (Ni). Though not illustrated, the backgate electrode 31 is electrically connected to the n-type gate region 18.

In this manner, the semiconductor device 40 includes the backgate electrode 31 as does the semiconductor device 30, and thus can improve the ON/OFF characteristic of the p-channel FET.

A manufacturing method of the semiconductor device 40 according to Sixth Embodiment is described below.

First, the first buffer layer (GaAs layer) 5 is epitaxially grown on the compound semiconductor substrate 2 of GaAs monocrystals. This is followed by the epitaxial growth of the n⁻GaAs layer 41 of n⁻GaAs doped with the n-type impurity Si at a low concentration of $1.0 \times 10^{10}$ to $4.0 \times 10^{11}$ atoms/cm². Then, as in Fourth Embodiment, the cap layer 26, the second buffer layer 15, the second channel layer 13, and the gate-leak prevention layer 14 are epitaxially grown sequentially, followed by the sequential epitaxial growth of the n-type first gate layer 18a and the n-type second gate layer 18b to form the n-type gate layer 21.

Then, as in Fourth Embodiment, the resistance layer 8b, the n-type charge supply layer 8a, the n-type second barrier layer 8, the first channel layer 7, and the n-type first barrier layer 6 are formed, followed by formation of the element isolation region 12 to electrically separate the pFET region 3 and the nFET region 4 from each other.

Thereafter, the n-type first barrier layer 6, the first channel layer 7, and the n-type second barrier layer 8 in the pFET region 3 are selectively removed. Then, the gate-leak prevention layer 14, the second channel layer 13, the second buffer layer 15, and the cap layer 26 on the region of the pFET region 3 where the backgate electrode 31 is to be formed are selectively removed.

Then, as in Fourth Embodiment, the n-type gate region 18 is formed, and the insulating film (silicon nitride film) 9 is deposited on the surfaces of the n-type first barrier layer 6 and the gate-leak prevention layer 14, and on the surfaces of the n⁻GaAs layer 41 and the element isolation region 12. As in Fourth Embodiment, the insulating film 9 is selectively removed to form opening portions, and Zn p-type impurities are introduced through the opening portions to simultaneously form the source and drain regions 16 in the pFET region 3, and the p-type gate region 10 in the nFET region 4. Thereafter, as in Fourth Embodiment, a metal film is deposited and selectively removed to simultaneously form source and drain electrodes 17 in the pFET region 3, and a gate electrode 11 in the nFET region 4.

Next, a protective film 25 of insulating material is deposited on the substrate surface, and second opening portions 23 are formed in the protective film 25 and the insulating film 9 on the both sides of the gate electrode 11 in the nFET region 4. Simultaneously, a third opening portion 32 is formed in the protective film 25 and the insulating film 9 formed on the n-type high-resistance layer 6c of the n-type first barrier layer 6 in the pFET region 3.

Then, a gold-germanium (AuGe) alloy and nickel (Ni) are deposited on the substrate surface in thicknesses of about 160 nm and about 40 nm, respectively, using a resistive heating method, and are selectively removed using a photolithography technique and an etching technique to simultaneously form the source and drain electrodes 24 and the backgate electrode 31. As a result, the p-channel FET illustrated in FIG. 16 is formed. The source and drain electrodes 24 have an ohmic contact with the n-type high-resistance layer 6c. The backgate electrode 31 also has an ohmic contact with the n-type high-resistance layer 6c. When forming the second opening portions 23 in the protective film 25 and the insulating film 9, an opening portion may be simultaneously formed over the n-type gate region 18 of the pFET region 3 to form the gate electrode for the pFET region 3, simultaneously with the source and drain electrodes 24 for the nFET region 4.

As described above, the manufacturing methods of the semiconductor devices 1, 20, 30, and 40 according to certain embodiments the present invention enable the p-channel FET and the n-channel FET to be simultaneously formed on the compound semiconductor substrate 2. Further, the methods enable pn junction-type gate regions to be simultaneously formed by providing the n-type gate region 18 for the p-type second channel layer 13 in the p-channel FET, and the p-type gate region 10 for the n-type first barrier layer 6 in the n-channel FET. Specifically, because the methods enable simultaneous formation of complementary FETs for an enhancement mode, complementary FETs capable of operating at high speed with reduced leak current can be fabricated in high density on a single compound semiconductor substrate.

The present application contains subject matter related to that disclosed in Japanese Priority Patent Applications JP 2009-180653 and JP 2010-031710 filed in the Japan Patent Office on Aug. 3, 2009 and Feb. 16, 2010, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a compound semiconductor substrate;
    a first conductivity type-channel field-effect transistor region formed on the compound semiconductor substrate, and that includes a first channel layer; a first conductivity type first barrier layer that forms a heterojunction with the first channel layer, and supplies a first conductivity type charge to the first channel layer; and a second conductivity type gate region that has a pn junction-type potential barrier against the first conductivity type first barrier layer; and a second conductivity type-channel field-effect transistor region formed on the compound semiconductor substrate, and that includes a second conductivity type second channel layer, and a first conductivity type gate region that has a pn junction-type potential barrier against the second conductivity type second channel layer, wherein the first conductivity type-channel field-effect transistor region is a region that includes the second conductivity type second channel layer, a first conductivity type gate layer formed simultaneously with the first conductivity type gate region, the first channel layer, and the first conductivity type first barrier layer laminated in this order above the compound semiconductor substrate.

2. The semiconductor device according to claim 1, wherein the second conductivity type-channel field-effect transistor region is a region that includes the first channel layer, the first conductivity type first barrier layer, and the second channel layer laminated in this order above the compound semiconductor substrate.

3. The semiconductor device according to claim 1, further comprising a gate-leak prevention layer between the first conductivity type gate region and the second conductivity type second channel layer.

4. The semiconductor device according to claim 3, wherein the second conductivity type second channel layer includes second conductivity type source and drain regions formed as diffused layers, and that are separated from each other with the first conductivity type gate region in between.

5. The semiconductor device according to claim 4, further comprising a first conductivity type second barrier layer formed between the compound semiconductor substrate and the first channel layer, and that supplies a first conductivity type charge to the first channel layer.

6. The semiconductor device according to claim 5, wherein the second conductivity type-channel field-effect transistor region includes a backgate electrode.

7. The semiconductor device according to claim 1, wherein the second conductivity type second channel layer includes second conductivity type source and drain regions formed as diffused layers, and that are separated from each other with the first conductivity type gate region in between.

8. The semiconductor device according to claim 1, further comprising a first conductivity type second barrier layer formed between the compound semiconductor substrate and the first channel layer, and that supplies a first conductivity type charge to the first channel layer.

9. The semiconductor device according to claim 1, wherein the second conductivity type-channel field-effect transistor region includes a backgate electrode.

10. A semiconductor device comprising:
a compound semiconductor substrate;
a first conductivity type-channel field-effect transistor region formed on the compound semiconductor substrate, and that includes a first channel layer; a first conductivity type first barrier layer that forms a heterojunction with the first channel layer, and supplies a first conductivity type charge to the first channel layer; and a second conductivity type gate region that has a pn junction-type potential barrier against the first conductivity type first barrier layer; and
a second conductivity type-channel field-effect transistor region formed on the compound semiconductor substrate, and that includes a second conductivity type second channel layer, and a first conductivity type gate region that has a pn junction-type potential barrier against the second conductivity type second channel layer,
wherein the second conductivity type-channel field-effect transistor region includes a backgate electrode, and
wherein the backgate electrode of the second conductivity type-channel field-effect transistor is formed on the first conductivity type first barrier layer.

11. A semiconductor device manufacturing method, comprising the steps of:
forming a multilayered film by the sequential epitaxial growth of a first buffer layer, a first channel layer, a first conductivity type first barrier layer, a second buffer layer, a second conductivity type second channel layer, and a first conductivity type gate layer on a compound semiconductor substrate;
selectively removing the first conductivity type gate layer to form a first conductivity type gate region for a second conductivity type-channel field-effect transistor;
selectively removing the second conductivity type second channel layer so as to lay out a second conductivity type-channel field-effect transistor region in which the second conductivity type second channel layer remains with the first conductivity type gate region, and a first conductivity type-channel field-effect transistor region in which the first conductivity type first barrier layer remains;
forming an insulating film simultaneously on exposed surfaces of the second conductivity type-channel field-effect transistor region and the first conductivity type-channel field-effect transistor region, and forming first opening portions through the insulating film;
diffusing impurities through the first opening portions to simultaneously form source and drain regions for the second conductivity type-channel field-effect transistor, and a gate region for a first conductivity type-channel field-effect transistor;
forming an element isolation region that electrically separates the second conductivity type-channel field-effect transistor region and the first conductivity type-channel field-effect transistor region from each other; and
forming a metal electrode in the source and drain regions for the second conductivity type-channel field-effect transistor, and in the gate region for the first conductivity type-channel field-effect transistor.

12. The method according to claim 11, further comprising the step of forming a backgate electrode for the second conductivity type-channel field-effect transistor on the first conductivity type first barrier layer simultaneously when forming a metal electrode in source and drain regions for the first conductivity type-channel field-effect transistor.

13. A semiconductor device manufacturing method, comprising the steps of:
forming a multilayered film by the sequential epitaxial growth of a first buffer layer, a second conductivity type second channel layer, a first conductivity type gate layer, a first conductivity type second barrier layer, a first channel layer, and a first conductivity type first barrier layer on a compound semiconductor substrate;
forming an element isolation region that electrically separates a second conductivity type-channel field-effect transistor region and a first conductivity type-channel field-effect transistor region from each other;
selectively removing the first conductivity type first barrier layer, the first channel layer, and the first conductivity type second barrier layer of the second conductivity type-channel field-effect transistor region;

selectively removing the first conductivity type gate layer of the second conductivity type-channel field-effect transistor region to form a first conductivity type gate region for a second conductivity type-channel field-effect transistor;

forming an insulating film simultaneously on exposed surfaces of the second conductivity type-channel field-effect transistor region and the first conductivity type-channel field-effect transistor region, and forming opening portions through the insulating film;

diffusing impurities through the opening portions to simultaneously form source and drain regions for the second conductivity type-channel field-effect transistor, and a gate region for a first conductivity type-channel field-effect transistor; and forming a metal electrode in the source and drain regions for the second conductivity type-channel field-effect transistor, and in the gate region for the first conductivity type-channel field-effect transistor.

14. The method according to claim 13, further comprising the step of forming a backgate electrode for the second conductivity type-channel field-effect transistor on the first conductivity type first barrier layer simultaneously when forming a metal electrode in source and drain regions for the first conductivity type-channel field-effect transistor.

* * * * *